(12) United States Patent
Wang et al.

(10) Patent No.: US 10,779,410 B2
(45) Date of Patent: Sep. 15, 2020

(54) CIRCUIT BOARD, ELECTRONIC COMPONENT AND DISPLAY APPARATUS

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Lingguo Wang, Beijing (CN); Xin Wang, Beijing (CN); Ying Liu, Beijing (CN); Yaodong Wang, Beijing (CN); Bin Fan, Beijing (CN); Binbin Liu, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/329,005

(22) PCT Filed: Jan. 19, 2018

(86) PCT No.: PCT/CN2018/073421
§ 371 (c)(1),
(2) Date: Feb. 27, 2019

(87) PCT Pub. No.: WO2019/007034
PCT Pub. Date: Jan. 10, 2019

(65) Prior Publication Data
US 2019/0208635 A1    Jul. 4, 2019

(30) Foreign Application Priority Data
Jul. 3, 2017  (CN) ..................... 2017 2 0792608 U

(51) Int. Cl.
| | | |
|---|---|---|
| H05K 1/11 | (2006.01) | |
| H05K 3/34 | (2006.01) | |
| H05K 1/02 | (2006.01) | |

(52) U.S. Cl.
CPC ............... H05K 1/117 (2013.01); H05K 1/02 (2013.01); H05K 1/11 (2013.01); H05K 3/3405 (2013.01);
(Continued)

(58) Field of Classification Search
CPC .............. H05K 1/111–117; H05K 3/34; H05K 2201/09381; H05K 2201/10128; H05K 2203/1178
See application file for complete search history.

(56) References Cited

U.S. PATENT DOCUMENTS

2008/0236871 A1\* 10/2008 Schaefer ................ H05K 1/111
                                                                174/250
2010/0206626 A1    8/2010 Chang et al.
(Continued)

FOREIGN PATENT DOCUMENTS

CN     101494951 A     7/2009
CN     201490179 U     5/2010
(Continued)

OTHER PUBLICATIONS

International Search Report; Application No. PCT/CN2018073421; dated Apr. 23, 2018; English Translation Attached.

*Primary Examiner* — Hoa C Nguyen
(74) *Attorney, Agent, or Firm* — Nath, Goldberg & Meyer; Joshua B. Goldberg

(57) ABSTRACT

The present disclosure provides a circuit board, an electrical component and a display apparatus. The circuit board includes a wiring pad which is divided into a plurality of sub-pads by bubble discharge paths, the bubble discharge (Continued)

paths intersect at a first point which is a geometric center of the wiring pad. By configuring bubble discharge paths with a shape of a straight line and as being intersected at the geometric center point of the wiring pad, the circuit board can discharge gas bubbles, generated when the wiring pad is soldered to a wiring terminal of other circuit board, from the geometric center point of the wiring pad to the edge thereof via the bubble discharge paths. Thus gas bubbles can be eliminated or reduced between the wiring pad and the wiring terminal when soldering, connection between the wiring pad and the wiring terminal can be more secure.

15 Claims, 2 Drawing Sheets

(52) U.S. Cl.
CPC ............ *H05K 2201/09381* (2013.01); *H05K 2201/10128* (2013.01); *H05K 2203/1178* (2013.01)

(56) References Cited

U.S. PATENT DOCUMENTS

| | | | |
|---|---|---|---|
| 2013/0083489 A1* | 4/2013 | Dimauro | ............... H05K 1/111 361/719 |
| 2019/0208635 A1 | 7/2019 | Wang et al. | |

FOREIGN PATENT DOCUMENTS

| | | |
|---|---|---|
| CN | 105355142 A | 2/2016 |
| CN | 205071464 U | 3/2016 |
| CN | 105552048 A | 5/2016 |
| CN | 106231789 A | 12/2016 |
| CN | 106535506 A | 3/2017 |
| CN | 106793456 A | 5/2017 |
| CN | 206851145 U | 1/2018 |

* cited by examiner

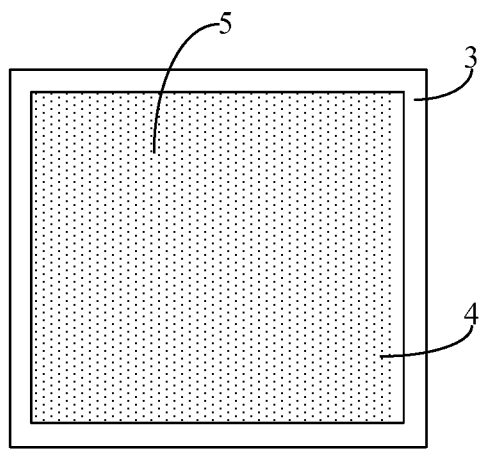
Fig.1 --Prior Art--
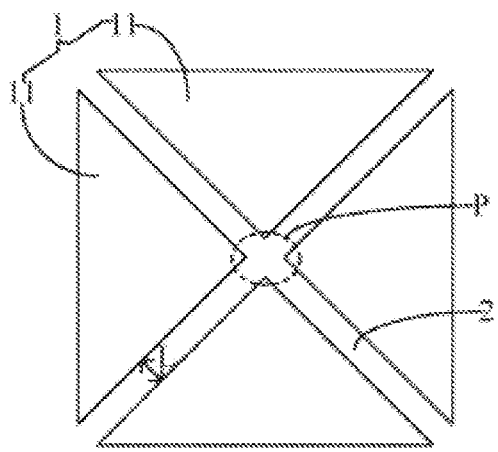
Fig.2
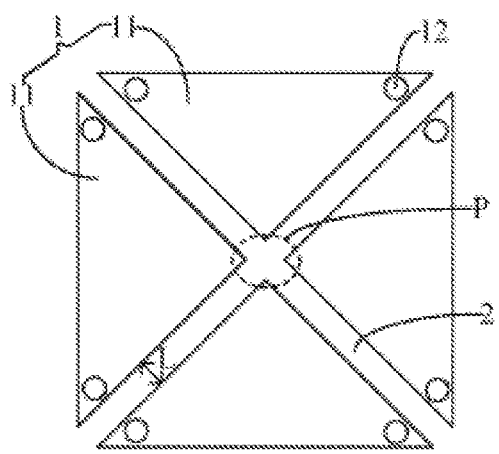
Fig.3

CIRCUIT BOARD, ELECTRONIC COMPONENT AND DISPLAY APPARATUS

CROSS-REFERENCE TO RELATED APPLICATION

This is a National Phase Application filed under 35 U.S.C. 371 as a national stage of PCT/CN2018/073421, filed Jan. 19, 2018, an application claiming the benefit of Chinese Patent Application No. 201720792608.1, filed Jul. 3, 2017, the disclosure of which is incorporated by reference herein in its entirety.

TECHNICAL FIELD

The present application relates to the field of wiring pad design, and in particular to a circuit board, an electrical component, and a display apparatus.

BACKGROUND

When a ground pad of a peripheral circuit board is soldered to a ground terminal of other electrical component, gas bubbles are generated between the ground pad and the ground terminal duo to failure of gas escape, generated from rapid oxidization of solvent or moisture in flux, before solder paste solidifies. Therefore, gas bubbles occur in the ground pad after the ground pad is soldered to the ground terminal.

SUMMARY

For the above technical problems existing in the related art, the present disclosure provides a circuit board, an electrical component, and a display apparatus. By configuring bubble discharge paths which divides a wiring pad as being intersected at a geometric center point of the wiring pad, the circuit board can discharge gas bubbles, generated when the wiring pad is soldered to a wiring terminal of other circuit board, from the geometric center point of the wiring pad to the edge thereof via the bubble discharge paths formed by dividing the wiring pad. Thus, gas bubbles can be eliminated or reduced between the wiring pad and the wiring terminal being soldered to each other, causing the joint between the wiring pad and the wiring terminal more secure, and a contact area between the wiring pad and the wiring terminal can be increased, resulting in easier heat dissipation after soldering.

The present disclosure provides a circuit board including a wiring pad provided with at least one bubble discharge path, and the at least one bubble discharge path extends through the wiring pad.

In an embodiment, the wiring pad is provided with a plurality of bubble discharge paths, and comprises a plurality of sub-pads divided by the plurality of bubble discharge paths, the plurality of bubble discharge paths intersect at a first point, and the first point is a geometric center of the wiring pad.

In an embodiment, the wiring pad is centrally symmetric, and the first point is a symmetric center of the wiring pad.

In an embodiment, the wiring pad is of a polygon or a circle, each side of the polygon has a length ranging from 1 to 2 mm, or a radius of the circle ranges from 1 to 2 mm, and the number of the plurality of sub-pads is 4 to 7.

In an embodiment, the polygon may be a rectangle, a pentagon or a hexagon.

In an embodiment, the wiring pad is divided into four centrally symmetrical blocks.

In an embodiment, the wiring pad is of a polygon or a circle, each side of the polygon has a length ranging from 2 to 4 mm, and or a radius of the circle ranges from 2 to 4 mm, and the number of the plurality of sub-pads is 8 to 12.

In an embodiment, the polygon is a rectangle, a pentagon or a hexagon.

In an embodiment, the wiring pad is divided into four centrally symmetrical blocks.

In an embodiment, the plurality of the sub-pads have a same area.

In an embodiment, the wiring pad is provided with at least one vent hole, and the at least vent hole is disposed in a peripheral edge region of the wiring pad.

In an embodiment, each of the plurality of sub-pads is provided with at least one vent hole.

In an embodiment, a distance between every two adjacent sub-pads ranges from 0.2 to 0.3 mm.

In an embodiment, the wiring pad includes a ground pad.

The present disclosure also provides an electrical component, including the above circuit board.

The present disclosure also provides a display apparatus including the above circuit board and/or the above electrical component.

In an embodiment, the display apparatus further includes a display panel, and the circuit board is a peripheral circuit board that is soldered and electrically connected to the display panel.

By configuring bubble discharge paths as being intersected at the geometric center point of the wiring pad, the circuit board can discharge gas bubbles, generated when the wiring pad is soldered to a wiring terminal of other circuit board, from a geometric center point of the wiring pad to the edge thereof via the bubble discharge paths formed by dividing the wiring pad. Thus, gas bubbles can be eliminated or reduced between the wiring pad and the wiring terminal when soldered to each other, causing the joint between the wiring pad and the wiring terminal more secure, and a contact area between the wiring pad and the wiring terminal can be increased, resulting in easier heat dissipation after soldering.

With the above circuit board, the electrical component according to the present disclosure can discharge gas bubbles, generated when the wiring pad is soldered to a wiring terminal of other circuit board, from the geometric center point of the wiring pad to the edge thereof via the bubble discharge paths formed by dividing the wiring pad. Thus, soldering gas bubbles can be eliminated or reduced between the wiring pad and the wiring terminal when soldered, the connection between the wiring pad and the wiring terminal can be more secure, and the contact area between the wiring pad and the wiring terminal can be increased, causing easier hear dissipation after soldering.

With the above circuit board or the above electrical component, the display apparatus according to the present disclosure can improve the production quality of the display apparatus, thereby improving display performance.

BRIEF DESCRIPTION OF THE DRAWINGS

FIG. 1 is a schematic diagram illustrating a large amount of gas bubbles existing in the ground pad after the ground pad is soldered to a ground terminal in the related art;

FIG. 2 is a schematic diagram s rating a wiring pad without a vent hole according to an embodiment of the present disclosure;

FIG. 3 is a schematic diagram illustrating a wiring pad provided with vent holes according to an embodiment of the present disclosure.

DETAILED DESCRIPTION

Figure 4:
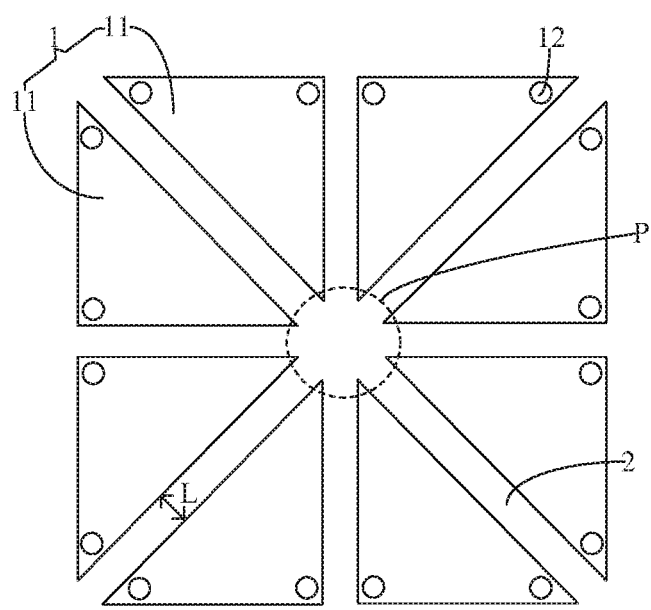
FIG. 4 is a schematic diagram illustrating a wiring pad on a circuit board according to an embodiment of the present disclosure.

In order to enable those skilled in the art to better understand the technical solutions of the present disclosure, a circuit board, an electrical component, and a display apparatus provided by the present disclosure are further described in detail below with reference to the drawings and embodiments.

At present, the problem of soldering gas bubbles is generally eliminated by controlling process parameters during manufacturing a peripheral circuit board, such as controlling a temperature of a workshop, a constant temperature time and a reflow time, or baking a layer of crystal material film, disposed in the peripheral circuit board and the electrical element for packaging inner circuits, to remove the moisture in the flux during the soldering process. However, a relatively large area of gas bubbles 5 still exist in the ground pad 3 after the ground pad 3 is soldered to the ground terminal 4, as shown in FIG. 1.

The presence of gas bubbles may cause a decrease in the contact area between the ground pad and the ground terminal, an increase in contact resistance, and a weak soldering joint between the ground pad and the ground terminal, which may eventually lead to circuit failure.

Therefore, how to eliminate soldering gas bubbles between the ground pad of the peripheral circuit board and the ground terminal of other electrical component has become an urgent problem to be solved.

An embodiment of the present disclosure provides a circuit board, as shown in FIG. 2, and the circuit board includes a wiring pad 1 which includes a plurality of sub-pads 11 divided by a plurality of bubble discharge paths 2 (which may also be referred to as division lined. The bubble discharge paths 2 formed by dividing the wiring pad each are in the shape of a straight line and intersect at a first point P which is the geometric center of the wiring pad 1.

By configuring bubble discharge paths which divide the wiring pad as being intersected at a geometric center point of the wiring pad, the circuit board can discharge gas bubbles, generated when the wiring pad is soldered to a wiring terminal of other circuit board, from a geometric center point of the wiring pad to the edge thereof via the bubble discharge paths formed by dividing the wiring pad. Thus, gas bubbles can be eliminated or reduced between the wiring pad and the wiring terminal when being soldered, causing the joint between the wiring pad and the wiring terminal more secure, and a contact area between the wiring pad and the wiring terminal can be increased, resulting in easier heat dissipation after soldering.

In an embodiment, the wiring pad is centrally symmetric, and the first point is the symmetric center of the wiring pad. This configuration facilitates the gas bubbles, generated when the terminal pad 1 is soldered to the wiring terminal of the other circuit board, to be discharged from the symmetric center of the terminal pad 1, thereby reducing the area occupied by the gas bubbles in a central portion of the wiring pad 1 and causing the soldering of the wiring pad 1 to the wiring terminal more secure, and the contact area between the wiring pad 1 and the wiring terminal larger, which is advantageous for heat dissipation after soldering.

In an embodiment, the wiring pad 1 is of a polygon or a circle, each side of the polygon has a length ranging from 1 to 2 mm, or a radius of the circle ranges from 1 to 2 mm, and the number of the sub-pads is 4 to 7. The polygon may be a rectangle, a pentagon or a hexagon. Since the wiring pad 1 of a polygon having a side length of 1 to 2 mm or a circle having a radius of 1 to 2 mm has a small area, the number of the sub-pads formed by dividing the wiring pad is small. For the wiring pad 1 with a small area, the number of the sub-pads formed by dividing the wiring pad should not be too large, because the contact area between the wiring pad 1 and the wiring terminal may be reduced in a case where too many sub-pads 11 are formed by dividing the wiring pad, thereby affecting contact and connection between the wiring pad 1 and the wiring terminal.

The wiring pad 1 may be rectangular in an embodiment, as shown in FIG. 2. The rectangular wiring pad 1 is divided to four pieces centrally symmetric to each other. This may facilitate gas, generated when the wiring pad 1 is soldered to the wiring terminal of other electrical circuit board, to be discharged from the symmetric center of the wiring pad 1 to the peripheral edge, thereby reducing bubble area in the central area of the wiring pad 1, causing more reliable soldering of the wiring pad 1 to the wiring terminal and larger contact area between the wiring pad 1 and the wiring terminal, which is advantageous for heat dissipation.

In an embodiment, the plurality of sub-pads 11 have a same area. Thus, the bubble discharge paths 2 for dividing the wiring pad 1 into the sub-pads 11 can be uniformly distributed from the center of the wiring pad 1 to the edge thereof, thereby facilitating uniform discharge of gas, generated in the central portion of the wiring pad 1 when being soldered, through the bubble discharge paths 2 to the peripheral edge region of the wiring pad 1. As such, the gas is prevented from being locally retained in the central region of the wiring pad 1, and a large area of the bubbles may not be formed in the central region of the wiring pad 1.

The wiring pad 1 is provided with a plurality of vent holes 12, as shown in FIG. 3, and the vent holes 12 are disposed in the peripheral edge region of the wiring pad 1. The vent holes 12 are disposed so that gas generated in the central region of the wiring pad 1 when being soldered can be discharged to the edge of the wiring pad 1 through the bubble discharge path and then can be discharged outside from the vent holes 12 on the edge of the wiring pad 1, thereby retention of gas in the peripheral edge region of the wiring pad 1 is prevented or reduced from forming bubbles, causing the more reliable soldering of the wiring pad 1 to the wiring terminal.

In an embodiment, the distance L between two adjacent sub-pads 11 ranges from 0.2 to 0.3 mm. That is, the width L of the bubble discharge path formed by dividing the wiring pad 1 ranges from 0.2 to 0.3 mm. The gas generated in the central region of the wiring pad 1 when being soldered can be discharged from the central region of the wiring pad 1 through the bubble discharge path, and the width of the bubble discharge path is set to ensure that the gas in the central region of the wiring pad 1 can be smoothly discharged to the edge region without airflow obstruction.

The wiring pad 1 includes a ground pad. In addition, the circuit board in an embodiment may be any circuit board integrated with a plurality of small electrical components, the other circuit board refers to a circuit board in a small electrical component, and the wiring terminal of the other circuit board refers to a ground terminal of the circuit board in the small electrical component. The ground terminal may include a ground pad and may be divided into a plurality of sub-pads. A plurality of ground pads are generally disposed on the circuit board, and each of the ground pads is configured for being soldered to the ground terminal on the small electrical component. Since the ground pad on the circuit board and the ground terminal on the small electrical component are generally larger than the other functional pins in area, soldering bubbles are easily generated when the ground pad is soldered to the ground terminal. Thus, the ground pad is divided into pieces to facilitate discharge of gas between the ground pad on the circuit board and the ground terminal of the circuit board in the small electrical component when being soldered.

A circuit board is provided in another embodiment of the present disclosure as shown in FIG. 4. Unlike some embodiments, the wiring pad 1 is a polygon or a circle, and each side of the polygon ranges from 2 to 4 mm, the radius of the circle ranges from 2 to 4 mm, and the number of the sub-pads 11 is 8 to 12.

The polygon may be a rectangle, a pentagon or a hexagon. Since the wiring pad 1 with the shape of a polygon having a side of 2 to 4 mm or a circular having a radius of 2 to 4 mm has a relatively large area, it can be divided into a relatively large number of sub-pads. Such a division may not affect contact and connection between the wiring pad 1 and the wiring terminal, instead, it can ensure that gas, generated in a central portion of the wiring pad with a relatively large area, is discharged through a plurality of bubble discharge paths to the edge region of the wiring pad. Thereby, retention of gas in the central region is prevented or reduced, thus reducing the area of the bubbles formed between the wiring pad 1 and the wiring terminal.

As shown in FIG. 4, the wiring pad 1 in an embodiment is rectangular. The rectangular wiring pad 1 is divided into eight pieces centrally symmetric to each other. This is advantageous for the gas, generated when the wiring pad 1 is soldered to the wiring terminal on other circuit board, to be discharged from the symmetrical center of the wiring pad 1 to the peripheral edge through the eight division gaps (i.e., the existing eight bubble discharge paths). Thereby, the bubble area in the central area of the wiring pad 1 is reduced, causing the more reliable soldering of the wiring pad 1 to the wiring terminal and a larger contact area between the wiring pad 1 and the wiring terminal, which is advantageous for heat dissipation.

Other structures of the circuit board in this embodiment are same as those in the above embodiments, and are not described herein again.

By configuring bubble discharge paths which divides a wiring pad as being intersected at a geometric center point of the wiring pad, the circuit board can discharge gas, generated when the wiring pad is soldered to the wiring terminal of other circuit board, from a geometric center point of the wiring pad to the edge thereof via the bubble discharge paths (division gaps) formed by dividing the wiring pad. Thus, bubbles can be eliminated or reduced between the wiring pad and the wiring terminal when being soldered to each other, causing more reliable joint between the wiring pad and the wiring terminal, and a contact area between the wiring pad and the wiring terminal can be increased, resulting in easier heat dissipation after soldering.

An electrical component provided by an embodiment of the present disclosure includes the above circuit board. That is, a wiring pad on a circuit board in the electrical component according to the present disclosure can be designed with the same structure as in the above embodiment. Such a configuration can enable the gas, generated when the wiring pad is soldered to the wiring terminal of other circuit board, to be discharged from the geometric center point of the wiring pad to the peripheral edge through the bubble discharge path formed by dividing the wiring pad. Thus, soldering bubbles are eliminated or reduced between the wiring pad and the wiring terminal when being soldered to each other, causing the more reliable connection between the wiring pad and the wiring terminal, which also increases the contact area between the wiring pad and the wiring terminal, resulting in easier heat dissipation after the wiring pad and the wiring terminal are soldered to each other.

It should be noted that, when the wiring pad on the circuit board in the electrical component is soldered to the wiring terminal on the other circuit board, only one of the wiring pad and the wiring terminal is set with the divided sub-pads. If both of the wiring pad and the wiring terminal are set with the divided sub-pads, it is not advantageous for good contact and connection between the wiring pad and the wiring terminal, and the bubble discharge paths of the wiring pad and the wiring terminal may be not aligned well, which is unfavorable for smooth discharge of gas in the center of the wiring pad when soldering.

By employing the circuit board according to the embodiments of the present disclosure, the electrical component according to some embodiments of the present disclosure ensures that gas, generated when the wiring pad on the circuit board in the electrical component is soldered to the wiring terminal on other circuit board, to be discharged from the geometric center point of the wiring pad to the edge thereof through bubble discharge paths formed by dividing the wiring pad. Thus, soldering bubbles are eliminated or reduced between the wiring pad and the wiring terminal when being soldered to each other, causing the more reliable connection between the wiring pad and the wiring terminal, and the contact area between the wiring pad and the wiring terminal can be increased, resulting in heat dissipation easier after soldering.

Some embodiments of the present disclosure provide a display apparatus including a circuit board according to embodiments of the present disclosure.

The display apparatus may further include a display panel, and the circuit board is a peripheral circuit board which is soldered and electrically connected to the display panel.

It should be noted that, the display apparatus may also include an electrical component according to embodiments of the present disclosure.

By using the circuit board or the electric component according to embodiments of the present disclosure, the quality of the display apparatus can be improved, thereby improving the display performance.

The display apparatus provided by the present disclosure may be any product or component with display function, such as a liquid crystal panel, a liquid crystal television, an OLED panel, an OLED television, a display screen, a mobile phone, a navigator and the like.

It can be understood that, the above embodiments are merely exemplary embodiments for explaining the principles of the present disclosure, and the present disclosure is not limited thereto. Various modifications and improvements can be made by those skilled in the art without departing from the spirit and scope of the disclosure, and such modifications and improvements are also considered to be within the scope of the disclosure.

What is claimed is:

1. A circuit board, comprising a wiring pad provided with at least one bubble discharge path, wherein the at least one bubble discharge path extends through the wiring pad, wherein the wiring pad is provided with a plurality of bubble discharge paths, and comprises a plurality of sub-pads divided by the plurality of bubble discharge paths, the plurality of the bubble discharge paths intersect at a first point, and the first point is a geometric center of the wiring pad; and wherein each of the plurality of the sub-pads is provided with at least one vent hole, the at least one vent hole of one sub-pad of the plurality of the sub-pads is provided at a peripheral edge region of the sub-pad and is proximal to a bubble discharge path adjacent to the sub-pad.

2. The circuit board according to claim 1, wherein the wiring pad is centrally symmetric, and the first point is a symmetric center of the wiring pad.

3. The circuit board according to claim 1, wherein the wiring pad is of a polygon or a circle, each side of the polygon has a length ranging from 1 to 2 mm, or a radius of the circle ranges from 1 to 2 mm, and the number of the plurality of sub-pads is 4 to 7.

4. The circuit board according to claim 3, wherein the polygon is a rectangle, a pentagon or a hexagon.

5. The circuit board according to claim 4, wherein the wiring pad is divided into centrally symmetric four blocks.

6. The circuit board according to claim 1, wherein the wiring pad is of a polygon or a circle, each side of the polygon has a length ranging from 2 to 4 mm, or a radius of the circle ranges from 2 to 4 mm, and the number of the plurality of sub-pads is 8 to 12.

7. The circuit board according to claim 6, wherein the polygon is a rectangle, a pentagon or a hexagon.

8. The circuit board according to claim 7, wherein the wiring pad is divided into four centrally symmetric blocks.

9. The circuit board according to claim 1, wherein the plurality of sub-pads have a same area.

10. The circuit board according to claim 1, wherein a distance between every two adjacent sub-pads ranges from 0.2 to 0.3 mm.

11. The circuit board according to claim 1, wherein the wiring pad comprises a ground pad.

12. An electrical component, comprising the circuit board according to claim 1.

13. A display apparatus, comprising the electrical component according to claim 12.

14. The display apparatus according to claim 13, further comprising a display panel, wherein the circuit board is a peripheral circuit board that is soldered and electrically connected to the display panel.

15. The circuit board according to claim 1, wherein the at least one vent hole is disposed in a peripheral edge region of the wiring pad distal to the geometric center of the wiring pad.

* * * * *